(12) United States Patent
Awad (10) Patent No.: US 10,333,394 B2
(45) Date of Patent: Jun. 25, 2019

(54) SWITCHED-CAPACITOR BUFFER AND RELATED METHODS

(71) Applicant: MediaTek Inc., Hsin-Chu (TW)

(72) Inventor: Ramy Awad, Irvine, CA (US)

(73) Assignee: MediaTek Inc., Hsin-Chu (TW)

( * ) Notice: Subject to any disclaimer, the term of this patent is extended or adjusted under 35 U.S.C. 154(b) by 124 days.

(21) Appl. No.: 15/335,956

(22) Filed: Oct. 27, 2016

(65) Prior Publication Data

US 2017/0331366 A1    Nov. 16, 2017

Related U.S. Application Data

(60) Provisional application No. 62/336,173, filed on May 13, 2016.

(51) Int. Cl.
*H03B 1/00*    (2006.01)
*H03K 3/00*    (2006.01)
*H02M 3/07*    (2006.01)
*H03F 3/00*    (2006.01)
(Continued)

(52) U.S. Cl.
CPC .............. *H02M 3/07* (2013.01); *H03F 3/005* (2013.01); *H03F 3/301* (2013.01); *H03F 3/3069* (2013.01); *H03F 3/505* (2013.01); *H03F 2200/219* (2013.01); *H03F 2200/231* (2013.01); *H03F 2200/252* (2013.01); *H03F 2200/27* (2013.01); *H03F 2200/297* (2013.01); *H03F 2200/312* (2013.01); *H03F 2200/396* (2013.01); *H03F 2200/414* (2013.01); *H03F 2200/417* (2013.01); *H03F 2200/42* (2013.01); *H03F 2200/453* (2013.01); *H03F 2200/456* (2013.01); *H03F 2200/513* (2013.01); *H03F 2200/69* (2013.01)

(58) Field of Classification Search
CPC ....... H03K 19/00315; H03K 19/00361; H03K 19/0013; H03K 19/018521; H03K 17/164
USPC .................................................. 327/108, 112
See application file for complete search history.

(56) References Cited

U.S. PATENT DOCUMENTS

| | | | |
|---|---|---|---|
| 4,064,405 A * | 12/1977 | Cricchi | H03K 19/01721 326/34 |
| 6,801,186 B2 * | 10/2004 | Han | G09G 3/3688 345/103 |
| 7,482,864 B1 | 1/2009 | Murmann et al. | |

(Continued)

OTHER PUBLICATIONS

Extended European Search Report for Application No. 17170013.1 dated Oct. 12, 2017.

(Continued)

*Primary Examiner* — Anh Q Tra
(74) *Attorney, Agent, or Firm* — Wolf, Greenfield & Sacks, P.C.

(57) ABSTRACT

A line receiver comprising a switched capacitor circuit and a buffer is described. The buffer may be configured to receive, through the switched capacitor circuit, an analog signal. In response, the buffer may provide an output signal to a load, such as an analog-to-digital converter. The switched capacitor circuit may be controlled by a control circuitry, and may charge at least one capacitive element to a desired reference voltage. The reference voltage may be selected so as to bias the buffer with a desired DC current, and consequently, to provide a desired degree if linearity. The line receiver may further comprise a bias circuit configured to generate the reference voltage needed to bias the buffer with the desired DC current.

20 Claims, 5 Drawing Sheets

(51) Int. Cl.
*H03F 3/30* (2006.01)
*H03F 3/50* (2006.01)

(56) References Cited

U.S. PATENT DOCUMENTS

| | | | | |
|---|---|---|---|---|
| 7,868,658 B1* | 1/2011 | Miao | ............... | H03K 19/01852 |
| | | | | 326/68 |
| 8,441,315 B2* | 5/2013 | Kimura | ............... | G11C 19/184 |
| | | | | 330/264 |
| 2003/0030617 A1* | 2/2003 | Han | ............ | G09G 3/3688 |
| | | | | 345/98 |
| 2006/0017465 A1 | 1/2006 | Hatanaka | | |
| 2007/0159442 A1* | 7/2007 | Cheng | ............... | G09G 3/3685 |
| | | | | 345/100 |
| 2009/0315621 A1 | 12/2009 | Narathong et al. | | |
| 2010/0001800 A1 | 1/2010 | Milkov | | |

OTHER PUBLICATIONS

Shirazi et al., Linearity improvement of open-loop NMOS source-follower sample and hold circuits. IET Circuits Devices Syst. Jan. 21, 2011; vol. 5(1): 1-7.

* cited by examiner

SWITCHED-CAPACITOR BUFFER AND RELATED METHODS

RELATED APPLICATIONS

This Application claims priority under 35 U.S.C. § 119(e) to U.S. Provisional Application Ser. No. 62/336,173, entitled "LOW-VOLTAGE WIDEBAND SWITCHED-CAPACITOR BUFFER OVERVIEW" filed on May 13, 2016, which is herein incorporated by reference in its entirety.

BACKGROUND

Line receivers are used in electronics to receive signals transmitted through transmission lines. Some types of line receivers include analog-to-digital converters to convert the received signal into the digital domain.

SUMMARY

According to one aspect of the present application, a circuit is provided. The circuit may comprise a buffer configured to provide an output signal to a load in a first time period, in response to receiving an analog signal, wherein the buffer comprises at least two transistors, a capacitive element coupled to respective gate terminals of the at least two transistors, and configured to provide a DC signal to the respective gate terminals of the at least two transistors in the first time period, and a switch configured to couple the capacitive element to a DC reference voltage in a second time period.

In some embodiments, the switch is a first switch, and the circuit further comprises a second switch configured to couple the buffer to the load.

In some embodiments, the switch is a first switch, and the circuit further comprises a second switch configured to couple the analog signal to the buffer in the first time period.

In some embodiments, the second time period and the first time period are non-overlapping.

In some embodiments, the at least two transistors comprises a PMOS transistor and an NMOS transistor.

In some embodiments, the circuit further comprises control circuitry coupled to the switch and configured to place the switch in a conductive state in the second time period.

In some embodiments, the load comprises an analog-to-digital converter.

In some embodiments, the switch is configured to couple the capacitive element to the DC reference voltage, and the reference voltage is less than 1V.

According to another aspect of the present application, a circuit is provided. The circuit may comprise an analog-to-digital converter, a source-follower circuit coupled to the analog-to-digital converter and configured to drive the analog-to-digital converter with an analog signal in a first time period, wherein the source-follower circuit comprises at least two transistors, a capacitive element coupled to respective gate terminals of the at least two transistors, and configured to provide a DC signal to the respective gate terminals of the at least two transistors in the first time period, and a switch coupled to the capacitive element and configured to charge the capacitive element in a second time period.

In some embodiments, the capacitive element is configured to bias the source-follower circuit in a linear region.

In some embodiments, the switch is configured to charge the capacitive element to less than 1V.

In some embodiments, the circuit further comprises control circuitry coupled to the switch and configured to place the switch in a conductive state in the second time period.

In some embodiments, the at least two transistors comprise a PMOS transistor and an NMOS transistor.

In some embodiments, the NMOS transistor is a first NMOS transistor and the PMOS transistor is a first PMOS transistor, and further comprising a bias circuit coupled to the capacitive element, the bias circuit comprising a second PMOS transistor and a second NMOS transistor.

In some embodiments, the NMOS transistor and the PMOS transistor are coupled to each other through respective source terminals.

In some embodiments, the capacitive element is coupled between a first supply voltage and a second supply voltage, wherein the first and second supply voltages are different than zero and different from each other.

According to yet another aspect of the present application, a method is provided. The method may comprise charging a capacitive element in a first time period, providing a DC signal to respective gate terminals of at least two transistors with the capacitive element, sampling an analog signal and providing the analog signal to the at least two transistors in a second time period, and, in response to receiving the DC signal and the analog signal with the at least two transistors, driving a load during the second time period with an output signal.

In some embodiments, driving the load comprises driving an analog-to-digital converter.

In some embodiments, the first time period and the second time period are non-overlapping.

In some embodiments, charging the capacitive element comprises placing a switch in a conductive state in the first time period.

The foregoing summary is provided by way of illustration and is not intended to be limiting.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION

Discrete-time circuits, e.g., analog-to-digital converters, are often used in line receivers to sample the received signals. The inventors have recognized a challenge in the design of line receivers including discrete-time circuits that has risen as the size of integrated transistors decreases (e.g., as the complementary metal-oxide-semiconductor (CMOS) fabrication node decreases). In particular, smaller transistors may be less able to handle the voltage stresses, thus limiting the maximum voltage with which a circuit including such transistors can be supplied. In some circumstances, limiting the supply voltage presents a design trade-off between linearity and bandwidth. Alternatively or additionally, limiting the supply voltage may present a design trade-off between linearity and power consumption. Accordingly, conventional line receivers that include small transistors provide the desired degree of linearity at the expense of bandwidth or power consumption.

The inventor has developed a line receiver that can provide the linearity desired for discrete-time signal processing, without sacrificing bandwidth or power consumption. The line receiver developed by the inventors utilizes a switched capacitor circuit coupled to a buffer, e.g., a source-follower circuit. The switched capacitor circuit may be controlled to bias the buffer in a linear region, and the buffer may provide output signals to a load. Being a passive device, the power dissipated by the capacitive element(s) is significantly lower with respect to transistors or other active devices used in conventional line receivers. In some embodiments, a line receiver of the type described herein may be used to receive an analog signal from a transmission line and to drive an analog-to-digital converter with the received analog signal. Such line receivers may find application in chip-to-chip interconnects, board-to-board interconnects, data center routers or switches, cable interfaces, etc.

Figure 1:
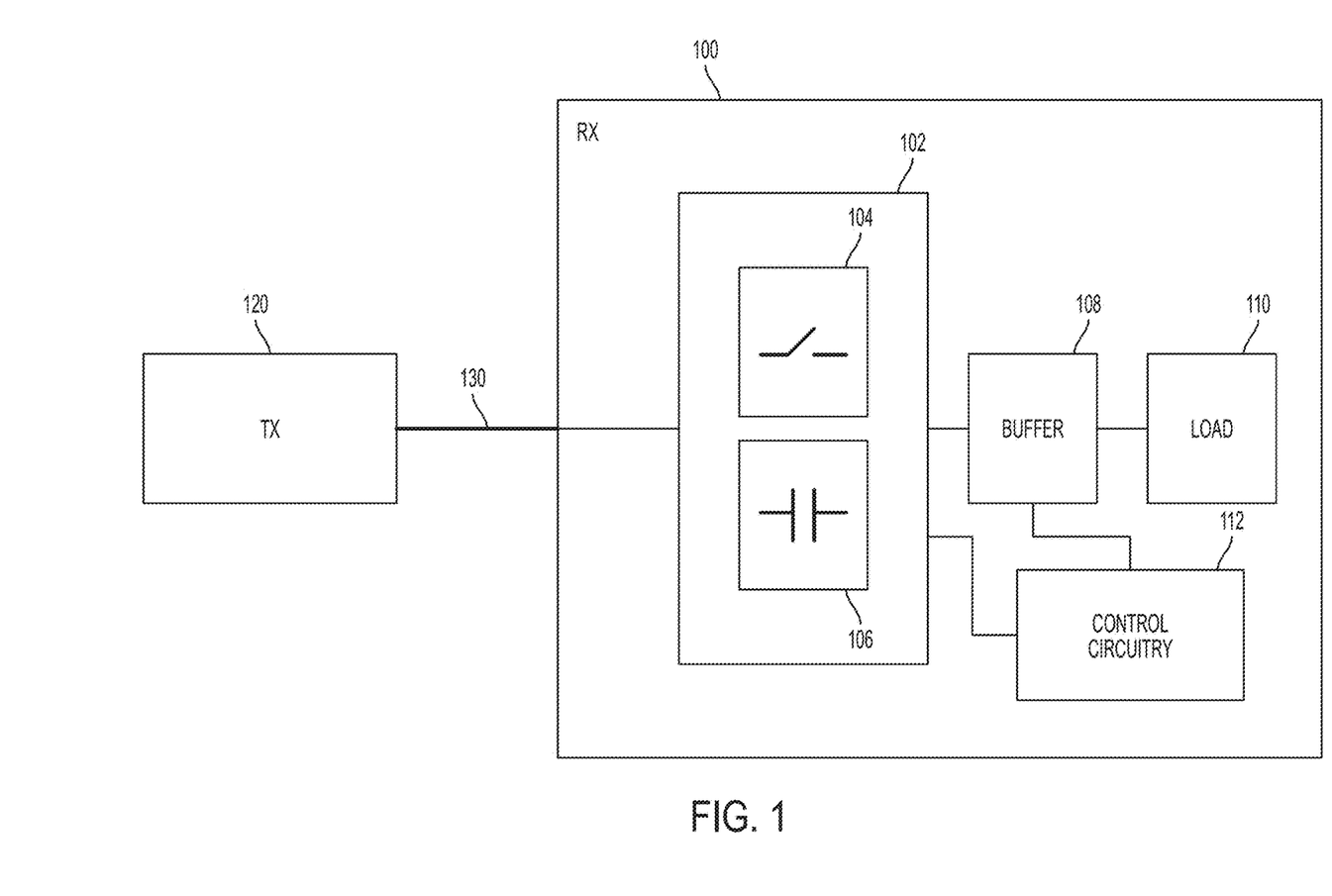
FIG. 1 is a block diagram illustrating a line receiver, according to some embodiments.

FIG. 1 is a block diagram illustrating a line receiver according to some embodiments. Line receiver 100 may comprise switched capacitor circuit 102, buffer 108, load 110 and control circuitry 112. Switched capacitor circuit 102 may comprise one or more switches, as illustrated in the box 104, and one or more capacitive elements, as illustrated in the box 106. The switch(es) and the capacitive element(s) may be coupled to one another in any suitable manner. Control circuitry 112 may be coupled to switched capacitor circuit 102 and to buffer 108, and may be configured to control the state of the switch(es). Control circuitry 112 may be implemented using any suitable analog or digital circuit, including a processor, an application-specific integrated circuit (ASIC), a field programmable gate array (FPGA), a microcontroller, etc.

Buffer 108 may receive, through switched capacitor circuit 102, an analog signal and may, in response, drive load 110 with an output signal. In some embodiments, buffer 108 comprises a source-follower circuit. In some embodiments, load 110 comprises an analog-to-digital converter. In some embodiments, control circuitry 112 may control the switched capacitor circuit 102 to charge the capacitive element(s) in a "reset" time period, and to sample the analog signal transmitted by transmitter 120 in a "sample" time period. In the reset time period, the control circuitry may charge the capacitive element(s) by connecting the capacitive element(s) to one or more DC reference voltages.

Line receiver 100 may be connected to transmitter 120 via transmission line 130. Transmission line 130 may comprise one or more metal traces on a circuit board or a cable, such as a twinax or a coax. Transmitter 120 may be any suitable type of electronic device configured to transmit electrical signals. For example, transmitter 120 may comprise a processor, a digital-to-analog converter, an amplifier, an antenna, or a waveform generator. Transmitter 120 may be configured to transmit data at more than 10 Gb/s, more than 20 Gb/s, more than 30 Gb/s, more than 40 Gb/s, more than 50 Gb/s, or more than any other suitable value. In some embodiments, transmitter 120 may operate between 40 Gb/s and 80 Gb/s, or within any range within such range.

As described above, buffer 108 may be implemented using a source-follower circuit (or an emitter-follower circuit) in some embodiments. In such embodiments, the buffer may comprise one or more transistors configured to operate in a common-drain mode (or common-collector mode). In some embodiments, the source-follower circuit may operate in a push-pull mode. A switched capacitor circuit may be used to provide a desired voltage bias to the source-follower circuit. For example, the switched capacitor may be coupled between the gate terminal of a first transistor and the gate terminal of a second transistor, and may be configured to hold a desired bias voltage between the two gate terminals.

Figure 2:
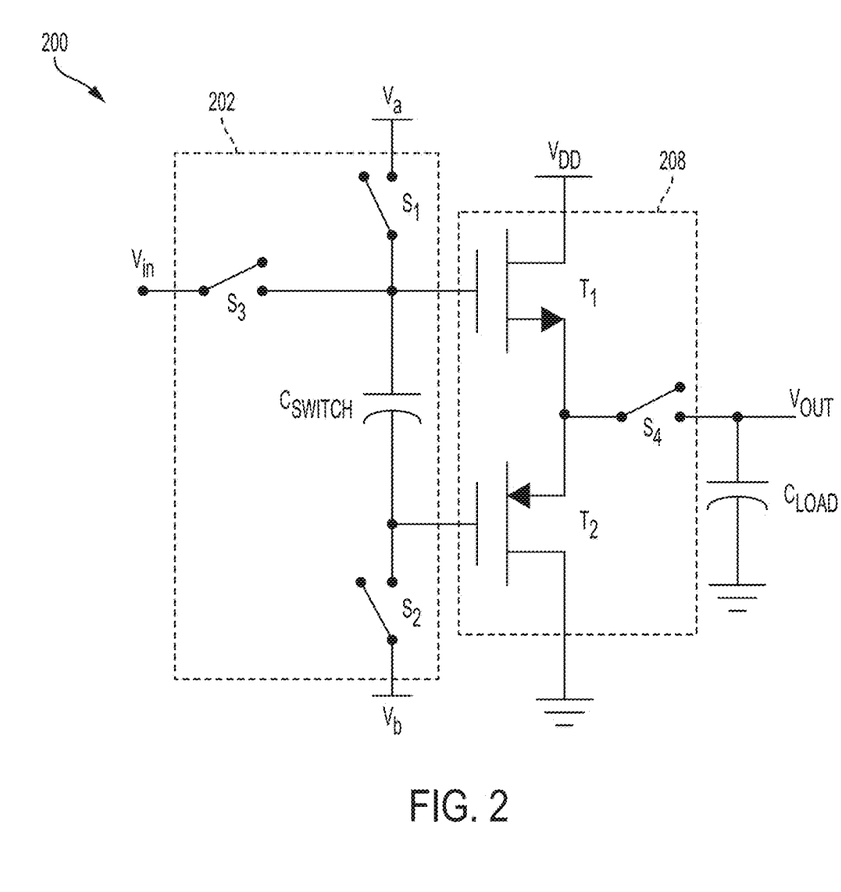
FIG. 2 is a circuit diagram illustrating a line receiver, according to some embodiments.

FIG. 2 is a circuit diagram illustrating an example of a line receiver. Line receiver 200 may comprise switched capacitor circuit 202, which may serve as switched capacitor circuit 102, buffer 208, which may serve as buffer 108 and capacitive element $C_{LOAD}$ which may serve as load 110. In some embodiments, $C_{LOAD}$ may represent the input impedance of an analog-to-digital converter, such as a successive approximation (SAR) analog-to-digital converter.

In some embodiments, buffer 208 may comprise a source-follower circuit. For example, buffer 208 may comprise a first transistor $T_1$ and a second transistor $T_2$. In some embodiments, transistors $T_1$ and $T_2$ are implemented using metal-oxide-semiconductor field-effect-transistors (MOSFET). However the application is not limited to MOSFETs, and other types of transistors may be used including bipolar junction transistors (BJT), heterojunction bipolar transistors (HBT), junction field effect transistors (JFET), metal-semiconductor field-effect-transistors (MESFET), etc. Transistor $T_1$ may be an n-channel metal-oxide-semiconductor (NMOS) transistor and transistor $T_2$ may be a p-channel metal-oxide-semiconductor (PMOS) transistor. Transistors $T_1$ and $T_2$ may be coupled to each other through the respective source terminals. Capacitive element $C_{LOAD}$ may be coupled to the source terminals of the transistors through switch S4, in some embodiments. The drain terminal of transistor $T_1$ may be coupled to a supply voltage $V_{DD}$. Supply voltage $V_{DD}$ may be equal to or less than 1V, equal to or less than 0.9V, equal to or less than 0.8V, equal to or less than 0.7V, or any other suitable value. The drain of transistor $T_2$ may be coupled to a second supply voltage lower than $V_{DD}$. For example, the drain of transistor $T_2$ may be coupled to a ground terminal.

Switched capacitor circuit 202 may comprise capacitive element $C_{SWITCH}$ and switches $S_1$, $S_2$ and $S_3$. Capacitive element $C_{SWITCH}$ may have a capacitance that is between 1 pF and 100 µF, for example, or within any suitable range within such range. Switch $S_1$ may be coupled between a first terminal of capacitive element $C_{SWITCH}$ and reference voltage $V_a$. Switch $S_2$ may be coupled between a second terminal of capacitive element $C_{SWITCH}$ and reference voltage $V_b$. The first terminal of the capacitive element may be coupled to the gate terminal of transistor $T_1$ and the second terminal of the capacitive element may be coupled to the gate terminal of transistor $T_2$. Switch $S_3$ may be coupled between a terminal of the capacitive element and an input terminal configured to receive an input signal $V_{in}$.

Switches $S_1$, $S_2$, $S_3$ and $S_4$ may be implemented using any suitable circuit or device. For example, each switch may be implemented using one or more transistors. Each switch may assume one of two possible states: a conductive state or a high-impedance state. In the conductive state, a switch may provide a low resistance between its terminals (e.g., less than 100Ω), while in the high-impedance state, it may provide a high resistance (e.g., more than 100 KΩ). The state of the switches may be controlled using control circuitry 112.

When $S_1$ and $S_2$ are in a conductive state, the capacitive element $C_{SWITCH}$ may be charged to approximately $V_a - V_b$. When $S_1$ and $S_2$ are switched to the high-impedance state, $C_{SWITCH}$ may hold such voltage, thus providing a fixed predetermined voltage between the gate terminals of transistors $T_1$ and $T_2$. In some embodiments, $V_a - V_b$ may be selected so as to operate transistors $T_1$ and $T_2$ in a conductive state (e.g., in saturation). For example, transistors $T_1$ and $T_2$ may operate as a class A amplifier. In this configuration, the linearity may be significantly improved at the expense of an increase in power consumption.

In some embodiments, $V_a$ may be derived from input signal $V_{in}$. For example, $V_a$ may be approximately equal to an average of $V_{in}$ (e.g., the root mean square or the arithmetic average). A resistive circuit (not shown in FIG. 2) may be used to derive $V_a$ from $V_{in}$.

As mentioned above, the DC bias point at which transistors $T_1$ and $T_2$ operate may impact the input/output linearity of the buffer. To provide an acceptable degree of linearity, it may be desirable to bias the transistors in the respective saturation regions and to prevent the transistors from entering their respective ohmic regions. In some embodiments, $V_b$ may be selected so as to cause transistors $T_1$ and $T_2$ to output a desired DC bias current $I_{BIAS}$, and consequently to exhibit a desired degree of linearity.

In some embodiments, a bias circuit may be utilized to bias transistors $T_1$ and $T_2$ with a desired DC bias current $I_{BIAS}$. The bias circuit may be designed to be=biased itself with the desired DC bias current, and in response, to provide a reference voltage $V_b$. When applied to switched capacitor circuit 202, reference voltage $V_b$ may cause transistors $T_1$ and $T_2$ to output DC bias current $I_{BIAS}$.

Figure 3:
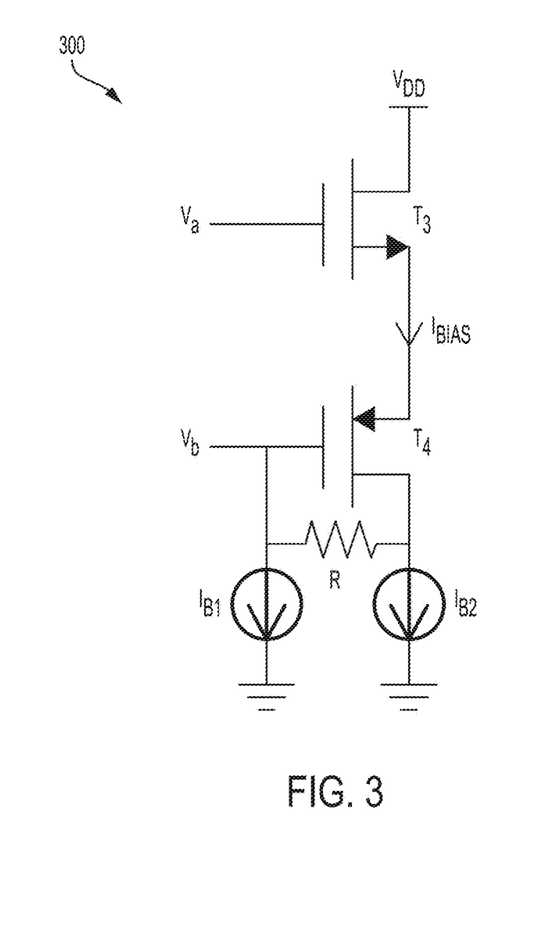
FIG. 3 is a circuit diagram illustrating a bias circuit, according to some embodiments.

FIG. 3 shows an example of such a bias circuit. Bias circuit 300 may comprise transistors $T_3$ and $T_4$, resistor R and current generators $I_{B1}$ and $I_{B2}$. In some embodiments, transistor $T_3$ may be an NMOS transistor and transistor $T_4$ may be a PMOS transistor. Transistor $T_3$ may have the same size (e.g., the width and/or the length of the drain well or source well) as transistor $T_1$, or may have a smaller size. Transistor $T_4$ may have the same size as transistor $T_2$, or may have a smaller size. In some embodiments, the ratio of the of transistor $T_1$ to the size of transistor $T_3$ is approximately equal (e.g., within a 10% margin error) to the ratio of the of transistor $T_2$ to the size of transistor $T_4$. Bias circuit 300 may be configured as a source-follower circuit. In some embodiments, the gate terminal of transistor $T_3$ may be driven with reference voltage $V_a$. In some embodiments, the currents sourced by current generators $I_{B1}$ and $I_{B2}$ may be configured to cause transistors $T_3$ and $T_4$ to output the desired DC bias current $I_{BIAS}$. In response, the gate terminal of transistor $T_4$ may output the desired reference voltage $V_b$. Due to the presence of resistor R, connected between an input terminal and an output terminal of transistor $T_4$, variations to $V_b$ caused by temperature and/or process variations may be limited.

Referring back to FIG. 2, the switches $S_1$-$S_4$ may be controlled to operate line receiver 200 in different phases. In the "reset" phase, capacitive element $C_{SWITCH}$ may be coupled to $V_a$ and $V_b$. In the "sample" phase, input signal $V_{in}$ may be provided to buffer 208, which in response, may drive the load with an output signal. In the "hold" phase, the load may be decoupled from buffer 208, thus causing $C_{LOAD}$ to maintain an approximately constant voltage (or slowly decreasing due to a leakage current). In the embodiments in which the load comprises an analog-to-digital converter, the voltage held during the hold phase may be converted into the digital domain.

Figure 4:
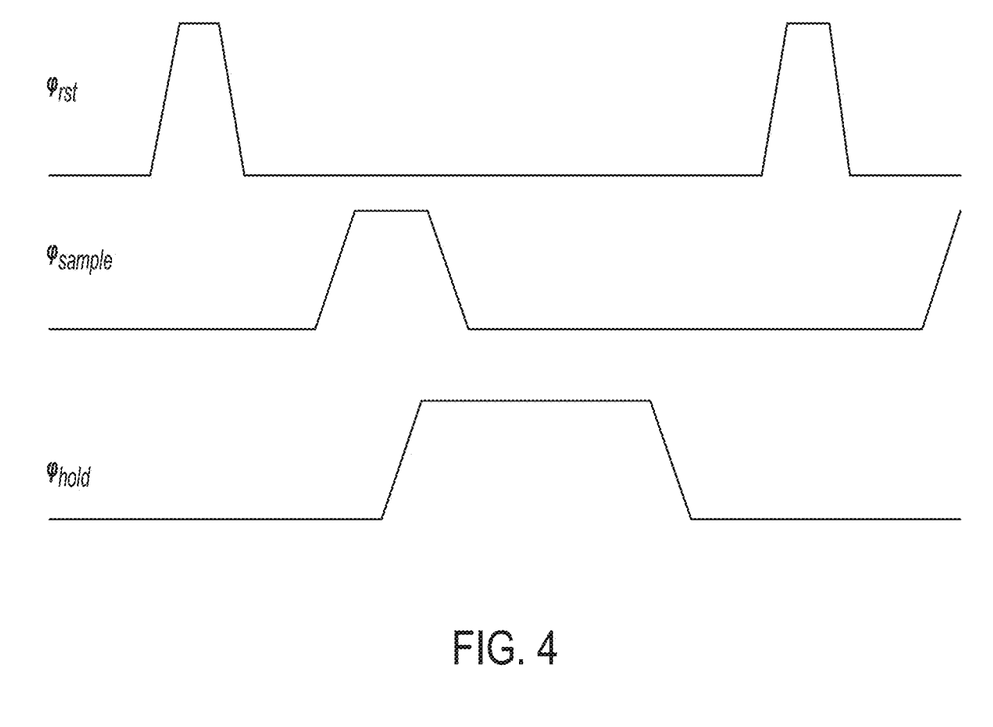
FIG. 4 is a plot illustrating a plurality of control signals, according to some embodiments.

FIG. 4 illustrates examples of the control signals used to drive the switches $S_1$, $S_2$, $S_3$ and $S_4$. In particular signal $\varphi_{rst}$ may be used to drive switches $S_1$ and $S_2$, signal $\varphi_{sample}$ to drive switch $S_3$, and signal $\varphi_{hold}$ to drive switch $S_4$. According to the convention used herein, when a control signal is equal to a logic 1, the corresponding switch is in a conductive state and when the control signal is equal to a logic 0, the corresponding switch is in a high-impedance state.

In the reset phase, $\varphi_{rst}$ may be equal to a logic 1, thus causing an increase in the voltage across the terminals of $C_{SWITCH}$ until $V_a - V_b$ is reached. When $\varphi_{rst}$ returns to a logic 0, the voltage of $C_{SWITCH}$ may remain approximately constant and equal to $V_a - V_b$ (or may slowly decrease due to a leakage current). In the sample phase, $\varphi_{sample}$ may be equal to a logic 1, thus providing input signal $V_{in}$ to buffer 208. During at least a portion of the sample phase, $\varphi_{hold}$ may be equal to a logic 1, thus causing buffer 208 to drive $C_{LOAD}$ with an output signal $V_{out}$. In the hold phase, $\varphi_{hold}$ may be equal to a logic 0, thus decoupling buffer 208 from $C_{LOAD}$, and causing $C_{LOAD}$ to maintain an approximately constant voltage. In some embodiments, the reset phase and the sample phase may be non-overlapping (as illustrated in FIG. 4). However, the application is not limited in this respect and the two phases may partially overlap. In some embodiments, the sample phase and the hold phase may partially overlap.

Figure 5:
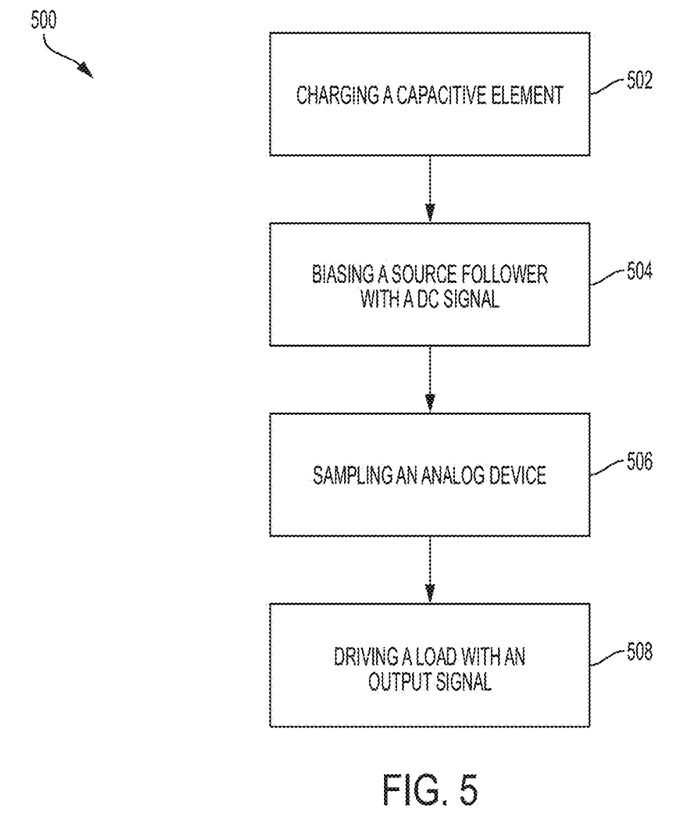
FIG. 5 is a flowchart illustrating a method of providing an analog signal to a load, according to some embodiments.

FIG. 5 illustrates a method for driving a capacitive load with an analog signal. Method 500 may begin at act 502, in which a capacitive element may be charged in a first time period, (e.g. the reset phase described in connection with FIG. 4). At act 504, the capacitive element may provide an approximately constant voltage to respective terminals of at least two transistors. The voltage may be selected so as to bias the transistors with a desired DC bias current, and to provide a desired degree of linearity. At act 506, the analog signal may be sampled, and may be provided to the transistors, in a second time period (e.g., the sample phase described in connection with FIG. 4). At act 508, in response to receiving the analog signal, the transistors may provide an output signal to the capacitive load.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including", "comprising", "having", "containing" or "involving" and variations thereof herein, is meant to encompass the items listed thereafter and equivalents thereof as well as additional items.

The use of "coupled" or "connected" is meant to refer to circuit elements, or signals, that are either directly linked to one another or through intermediate components.

What is claimed is:

1. A circuit, comprising:
a buffer configured to provide an output signal to a load in a first time period, in response to receiving an analog voltage, wherein the buffer comprises at least two transistors;
a capacitive element coupled to respective gate terminals of the at least two transistors, and configured to provide a DC signal to the respective gate terminals of the at least two transistors in the first time period, the capacitive element having a first terminal configured to be set to the analog voltage; and
a switch coupled between a DC reference voltage and the first terminal of the capacitive element and configured to set the first terminal of the capacitive element to the DC reference voltage in a second time period.

2. The circuit of claim 1, wherein the switch is a first switch, and further comprising a second switch configured to couple the buffer to the load.

3. The circuit of claim 1, wherein the switch is a first switch, and further comprising a second switch configured to couple the analog voltage to the buffer in the first time period.

4. The circuit of claim 3, wherein the second time period and the first time period are non-overlapping.

5. The circuit of claim 1, wherein the at least two transistors comprises a PMOS transistor and an NMOS transistor.

6. The circuit of claim 1, further comprising control circuitry coupled to the switch and configured to place the switch in a conductive state in the second time period.

7. The circuit of claim 1, wherein the load comprises an analog-to-digital converter.

8. The circuit of claim 1, wherein the reference voltage is less than 1V.

9. A circuit, comprising:
an analog-to-digital converter;
a source-follower circuit coupled to the analog-to-digital converter and configured to drive the analog-to-digital converter with an analog voltage in a first time period, wherein the source-follower circuit comprises at least two transistors;
a capacitive element coupled to respective gate terminals of the at least two transistors, and configured to provide a DC signal to the respective gate terminals of the at least two transistors in the first time period, the capacitive element having a first terminal configured to be set to the analog voltage;
a switch coupled between a DC reference voltage and the first terminal of the capacitive element and configured to set the first terminal of the capacitive element to the DC reference voltage in a second time period.

10. The circuit of claim 9, wherein the capacitive element is configured to bias the source-follower circuit in a linear region.

11. The circuit of claim 9, wherein the switch is configured to charge the capacitive element to less than 1V.

12. The circuit of claim 9, further comprising control circuitry coupled to the switch and configured to place the switch in a conductive state in the second time period.

13. The circuit of claim 9, wherein the at least two transistors comprise a PMOS transistor and an NMOS transistor.

14. The circuit of claim 13, wherein the NMOS transistor is a first NMOS transistor and the PMOS transistor is a first PMOS transistor, and further comprising a bias circuit coupled to the capacitive element, the bias circuit comprising a second PMOS transistor and a second NMOS transistor.

15. The circuit of claim 13, wherein the NMOS transistor and the PMOS transistor are coupled to each other through respective source terminals.

16. The circuit of claim 9, wherein the capacitive element is coupled between a first supply voltage and a second supply voltage, wherein the first and second supply voltages are different than zero and different from each other.

17. A method comprising:
in a first time period, setting a first terminal of a capacitive element to a DC reference voltage;
providing a DC signal to respective gate terminals of at least two transistors with the capacitive element;
in a second time period, setting the first terminal of the capacitive element to an analog voltage and providing the analog voltage to the at least two transistors; and
in response to receiving the DC signal and the analog voltage with the at least two transistors, driving a load during the second time period with an output signal.

18. The method of claim 17, wherein driving the load comprises driving an analog-to-digital converter.

19. The method of claim 17, wherein the first time period and the second time period are non-overlapping.

20. The method of claim 17, wherein setting the first terminal of the capacitive element to the analog voltage comprises placing a switch in a conductive state in the first time period.

* * * * *